United States Patent [19]

Beun

[11] Patent Number: 4,569,001
[45] Date of Patent: Feb. 4, 1986

[54] MOUNTING FOR LINE CARDS ON CIRCUIT BOARDS IN TELECOMMUNICATIONS APPARATUS

[75] Inventor: Roger A. Beun, Dunrobin, Canada

[73] Assignee: Northern Telecom Limited, Montreal, Canada

[21] Appl. No.: 555,669

[22] Filed: Nov. 28, 1983

[51] Int. Cl.⁴ ............................................. H05K 7/14
[52] U.S. Cl. ..................................... 361/412; 211/41; 361/413; 361/415
[58] Field of Search ............... 361/393, 394, 395, 399, 361/412, 413, 414, 415, 389; 211/41

[56] References Cited
U.S. PATENT DOCUMENTS 4,064,551 12/1977 Lightfoot ............................ 361/399
4,388,672 6/1983 Skill ..................................... 361/412
4,435,724 3/1984 Ralstin ......................... 174/52 FP X

OTHER PUBLICATIONS

G. E. Meyer, Method of Retaining Cable Cards, IBM Tech. Disc. Bull., V. 20 #5, Oct. 1977, p. 1886.

Primary Examiner—R. R. Kucia
Attorney, Agent, or Firm—Sidney T. Jelly

[57] ABSTRACT

A mounting for line cards on circuit boards, as used in telecommunications systems comprises a molded plastic frame having a plurality of mounting positions for ceramic circuit members. Each position comprises two parallel, spaced guide and support members having upper and lower guide formations spaced along each guide and support member. There is a plurality of substrate holders, a holder for each position, each holder having a flat support surface with upstanding projecting members at front and rear ends, with undercuts for reception of a ceramic circuit member or substrate. Each holder has a front member extending normal to the support surface and has a latching and ejecting member at the front end. The frame also has support and guide formations at a rear end for attachment of a circuit board.

11 Claims, 19 Drawing Figures

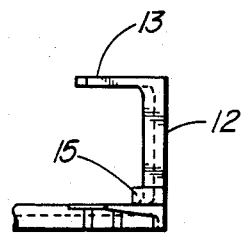
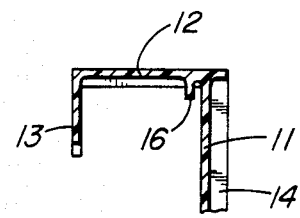
FIG. 5    FIG. 6
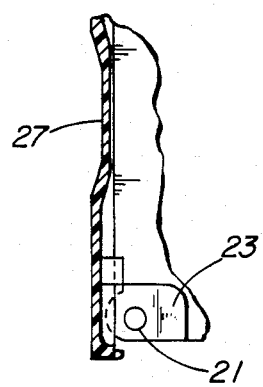
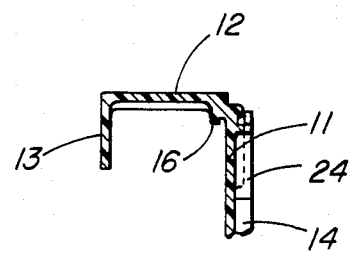
FIG. 7    FIG. 8
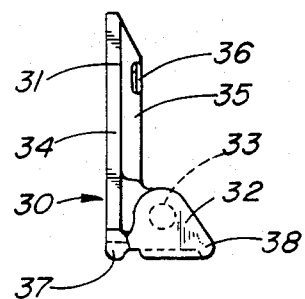
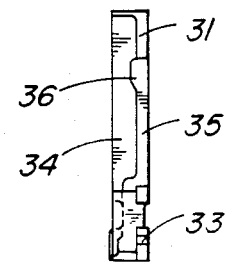
FIG. 9    FIG. 10
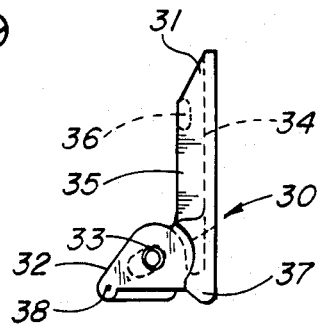
FIG. 11

MOUNTING FOR LINE CARDS ON CIRCUIT BOARDS IN TELECOMMUNICATIONS APPARATUS

This invention relates to a mounting for line cards, such as are used in telecommunications systems, and which line cards are mounted in holders attached to a circuit board.

Particularly, the line cards comprise ceramic hybrid circuit members, and are mounted on a molded plastic substrate holder which in turn are inserted in a holder in the form of a molded plastic frame. The frame attaches to a circuit board. There is provided a very compact, efficient mounting for line cards. Latching and ejection is obtained for each substrate holder. The molded frame is designed to permit easy injection molding while still providing guidance and support for the ceramic circuit members.

Broadly, the invention comprises a molded plastic frame having a plurality of mounting positions for ceramic circuit members, each position comprising two parallel, spaced guide and support members having upper and lower guide formations spaced along the length of the guide and support members; a plurality of substrate holders, a holder for each position, each holder having a flat support surface with upstanding projecting members at front and rear ends, the projecting members having undercuts for retention of a ceramic circuit member, each holder having a front member extending normal to the support surface and a latching and ejection member at the front end; said frame further including support and guide formations at a rear end for attachment to a circuit board. Latching and withdrawal members can be provided at a forward end.

The invention will be readily understood by the following description, in conjunction with the accompanying drawings, in which:

FIG. 5 is a partial side view in the direction of Arrow D in FIG. 1;

FIGS. 6, 7 and 8 are cross-sections through the front end of the holder on the lines VI—VI, VII—VII and VIII—VIII respectively, of FIG. 3;

FIG. 9 is one side view of a latch member for the holder;

FIG. 10 is a back view of the latch and FIG. 11 is a view on the other side of the latch of FIG. 9;

Figure 1:
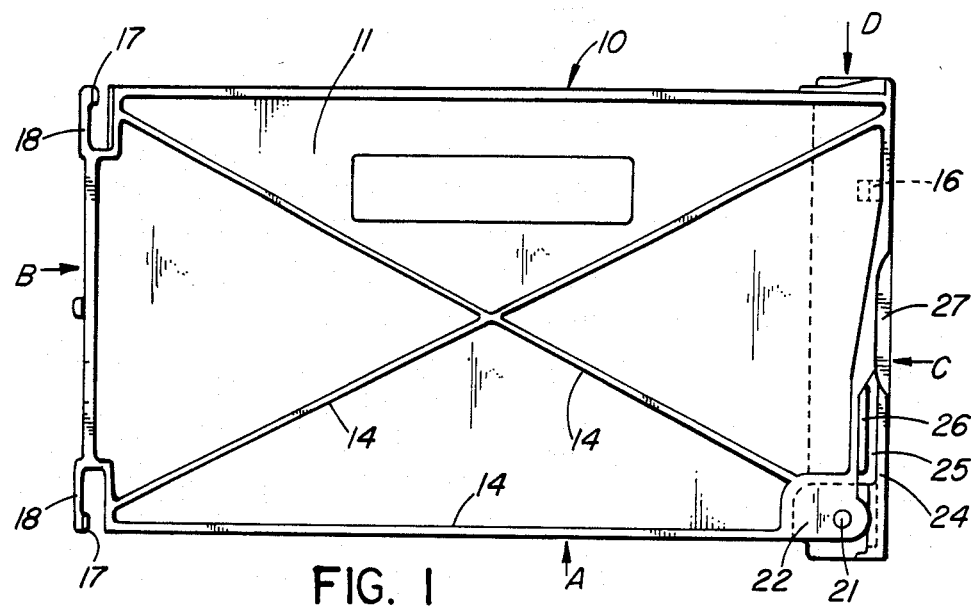
FIG. 1 is a bottom plan view of a substrate holder.
Figure 2:
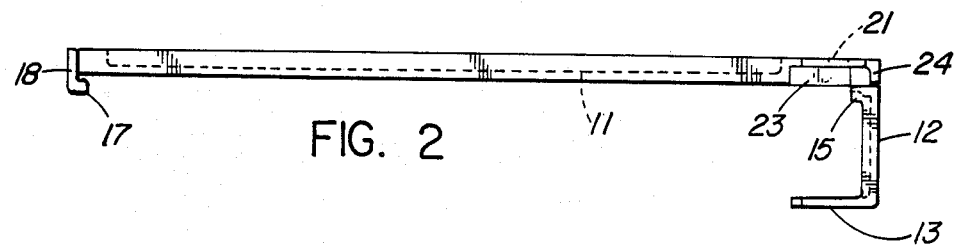
FIG. 2 is a side view in the direction of Arrow A in FIG. 1.
Figure 3:
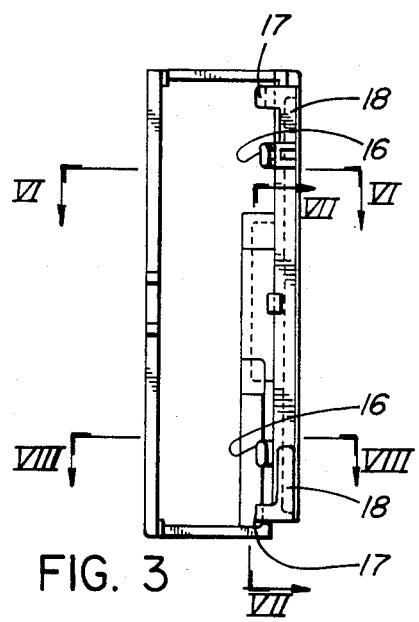
FIG. 3 is an end view in the direction of Arrow B in FIG. 1.
Figure 4:
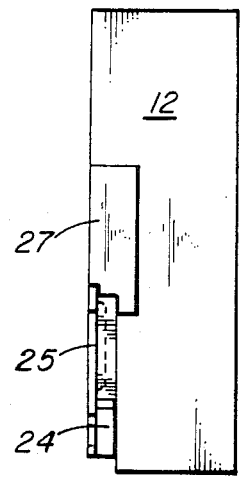
FIG. 4 is an end view in the direction of Arrow C in FIG. 1.

As illustrated in FIGS. 1 to 8, a molded plastic substrate holder, indicated generally at 10, has a flat support portion 11 with a web 12 at one end extending normal to the flat support portion 11. A further web 13 extends from the outer edge of the web 12, normal to the web 12. The web 13 extends over and parallel to the support portion 11. The support portion, in the example, has strengthening ribs 14 on the bottom surface. At the junction of portion 11 and web 12, at each side, is a small projection 15, which act as lateral locators. Also at the junction of portion 11 and web 12 spaced in from the projections 5, are two ribs 16 spaced up a short distance from the top surface of the portion 11. The spacing of projections 16 from portion 11 is such that the front end of a ceramic circuit member can slide under with minimal clearance.

At the rear end of portion 11, at the corners, are two projections 17 flexibly attached to the end of portion 11 by arms 18. The projections 17 have downwardly facing surfaces which are spaced from the top surface of portion 11 to receive the rear end of a ceramic circuit member. To mount a ceramic circuit member on a holder, the front end of the circuit member is inserted under the ribs 16 and inside projections 15. The arms 18 are flexed outwardly and the projections 17 snap over the rear end of the circuit member.

At the forward end, on the outer side of web 12, is a latching and ejection member. This member, shown separately in FIGS. 9, 10 and 11, is pivotally supported in a hole 21 at a front corner. The corner is reinforced by a flat portion 22, but the corner is also recessed on the top surface, indicated at 23, so that the mounting portion of the latch fits beneath the ceramic circuit member and is held in position by the circuit member.

The front web 12 is also recessed, at 24, to receive an extension or lever on the latch. An intermediate rib 25 in the recess 24 forms a detent 26 into which a rib on the latch lever snaps. A recess 27 in the outer surface of the front web 12 provides access to the end of the latch lever by a finger of the user.

The latch member is shown to a slightly larger scale in FIGS. 9, 10 and 11. The latch, indicated generally at 30, comprises a lever 31 and a thin web 32 extending from one end of the lever. The web is generally triangular and carries a short pivot 33 extending from its bottom surface. The pivot fits in the hole 21. The lever is of angle cross-section with two webs 34 and 35 extending at right angles to each other. On web 35, towards the outer end, is a short rib 36. Rib 36 snaps over the rib 25 on the support. The triangular shape of the web 32 limits pivotal movement of the latch to approximately 90°. The latch is assembled to the holder in an open position with the pivot being inserted in the hole 21, the web 32 in the recess 23. The ceramic circuit member is then mounted on the holder. The latch can be rotated to close the lever into the recess 24.

The latch has a short extension 37 on the lever 31. When a holder is held in a frame, pivoting of the latch causes the extension to push against a surface on the frame and initiates removal of the holder from the frame. When a holder is fully inserted, with the latch closed, a small projection 38 on the web 32 snaps into a detent in the frame. As the latch is held closed by the engagement of rib 36 behind rib 25, the engagement of projection 38 in a detent prevents undesired movement of a holder, and circuit member, out of the frame.

Figure 12:
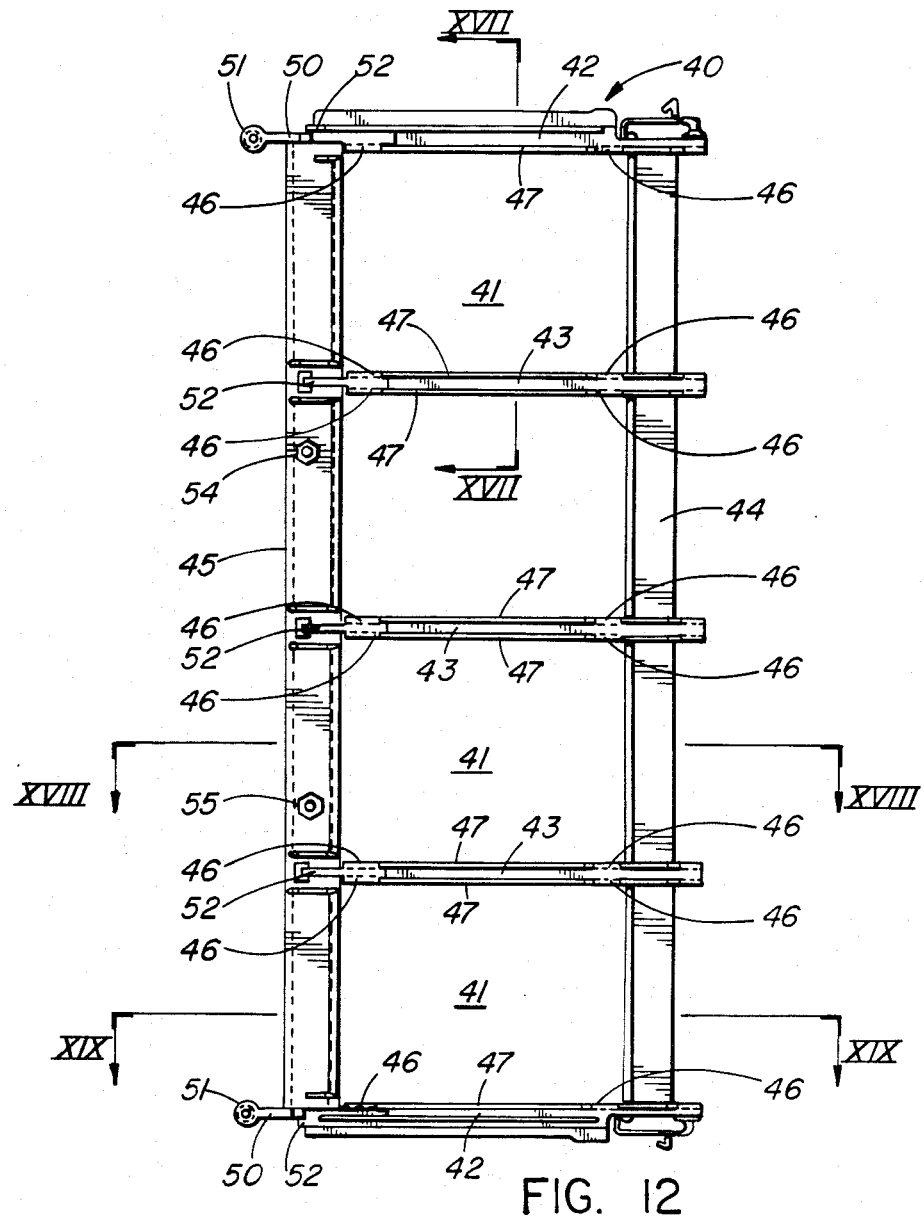
FIG. 12 is a top plan view of a frame for holding a plurality of substrate holders.
Figure 13:
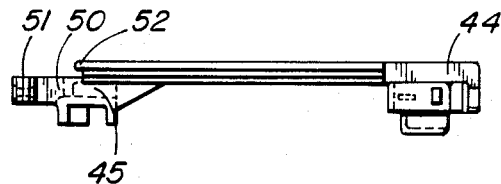
FIGS. 13, 14 and 15 are views in the directions of Arrows E, F and G respectively, of FIG. 12.
Figure 14:
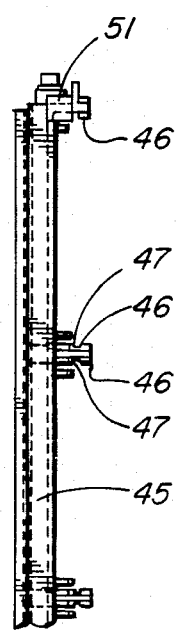
Figure 15:
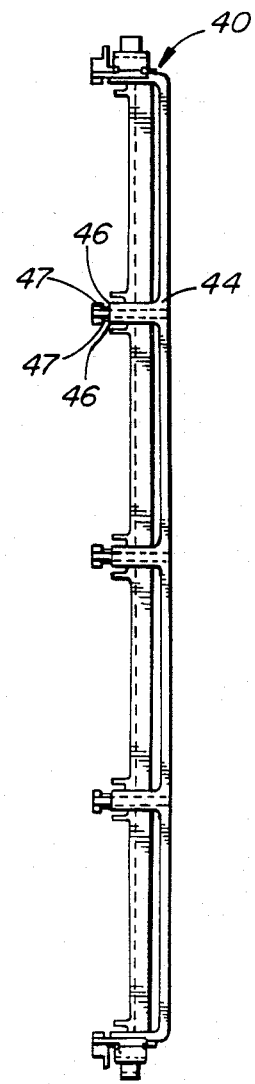
Figure 16:
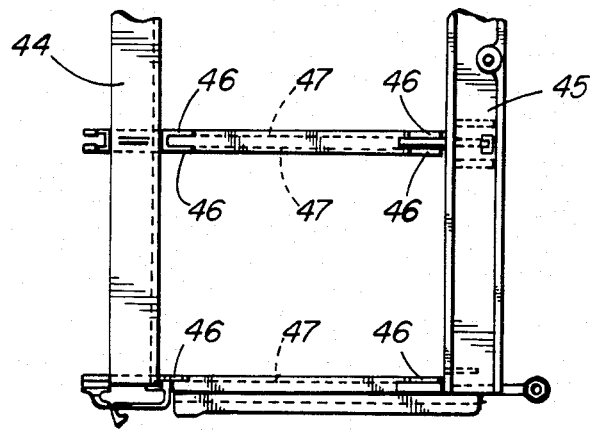
FIG. 16 is a partial bottom plan view of the frame of FIG. 12.
Figure 17:
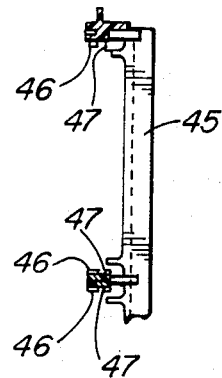
FIGS. 17, 18 and 19 are cross-sections on the lines XVII—XVII, XVIII—XVIII and XIX—XIX respectively, on FIG. 12.
Figure 18:
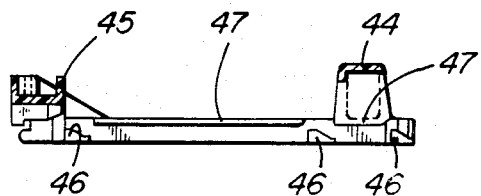
Figure 19:
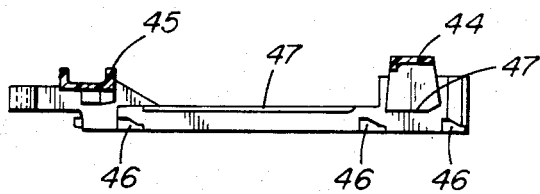

FIGS. 12 to 19 illustrate, in various views, a molded frame 40 for holding a plurality of holders with ceramic circuit boards. The frame of the example illustrated has four positions, 41, for holders and boards. The frame has five spaced parallel support and guide members in the form of two end members 42 and three intermediate members 43. These members are connected across their ends by a front member 44 and a rear member 45.

The end members 42 and intermediate members 43 are provided with support and guide formations on their side surfaces. These formations are spaced along the members and are also spaced in a direction normal to the plane of the frame. The formations are indicated at 46 and 47 in FIG. 12 and FIGS. 14 and 15, but are seen in their relative positioning more clearly in FIGS. 18 and 19.

By spacing the formations along the members, it is possible to very easily injection mold the frame. Each of the formations 46 and 47 avoids overlapping in the direction of the length of a member. This is particularly seen in FIGS. 18 and 19. It will be seen that what can be termed lower formations 46 are clear of the top or upper formations 47. In no position on the frame is there a recess extending laterally, always there is only one surface above or below, making injection molding very easy. The formations 46 are formed with inclined forward edges, at 48, to make it easier sliding the holders into position.

The frame 40 is normally attached to one edge of a circuit board. This is obtained by providing formations along the rear edge of rear member 45. At each end an arm 50 extends rearwardly and ends in a hollow boss 51. At the rear end of each support and guide member 42, 43, there is a short projection 52. A circuit board is attached by resting on top of the arms 50 with its edge engaged under the projections 52. The circuit board is then fixed in position by screws passing through the circuit board and the hollow bosses 51, and fastened by nuts. Two arms and associated hollow bosses are usually sufficient, but additional arms and bosses can be provided, aligned with one or more of the intermediate members 43.

At each end of the front member 44 a latch and withdrawal member is provided. It is mounted in a formation indicated at 53. This latch and withdrawal arrangement is described in detail in co-pending application Ser. No. 555,500, filed Nov. 28, 1983 entitled LATCHING AND WITHDRAWING ASSEMBLY FOR PLUG-IN CIRCUIT PACKS in the same name as the present application.

It is possible to mount a further circuit board on one assembled circuit board and frame. This is obtained by using extra thick nuts on the screws which pass through bosses 51 so that further screws can be positioned in the nuts from the other side. Captive nuts are also provided in the rear member 45, as indicated at 54.

What is claimed is :

1. A mounting for line cards on circuit boards, comprising:
    a molded plastic frame having a plurality of mounting positions for ceramic circuit members, the mounting positions extending side-by-side in a common plane, each mounting position having two parallel spaced guide and support members, each guide and support member having first and second sets of guide formations, the sets being spaced apart in a direction normal to said common plane, the formations in a set being spaced apart along a guide and support member, said frame having front and rear edges;
    a plurality of substrate holders, a holder for each said mounting position, each holder having a flat support surface and projections extending from said flat support surface at each end of the support surface, the projections having undercuts for positioning and retention of a ceramic circuit member, each holder also having a web extending normal to said flat support surface at one end of the support surface;
    a latching and ejection member pivotally mounted at one corner of each holder at said one end of said flat support surface, for engagement with said front edge of said frame; and
    support and guide formations at said rear edge of said frame for attachment to a circuit board.

2. A mounting as claimed in claim 1, including a latching and withdrawal member at each side of said front edge of said frame.

3. A mounting as claimed in claim 1, the guide formations of said first set on each of said guide and support members being positioned intermediate the guide formations of said second set.

4. A mounting as claimed in claim 1, said frame having two side guide and support members, and a plurality of intermediate guide and support members extending parallel to and positioned between said side members, said side guide and support members having said guide formations on an inner side and said intermediate guide and support members having said guide formations on each side.

5. A mounting as claimed in claim 1, said projections at an end of each support surface remote from said web extending from a free end of a cantilever arm at each corner of said support surface.

6. A mounting as claimed in claim 1, said latching and ejecting member on each holder comprising;
    a lever portion;
    a web portion extending laterally from the lever at one end thereof;
    a pivot extending from a surface of the web portion and positioned in a hole at said one corner of said holder;
    a projection on said lever portion at said one end, extending beyond said web portion;
    a projection on said web portion extending in the same direction as said projection on said lever portion and spaced therefrom;
    said projection on said web portion engaged in a recess in said frame when said lever portion is in a latched position;
    said projection on said lever portion bearing against a front surface on said frame when said lever is moved to an unlatched position to initiate ejection of said holder from said frame;
    interengaging formations on said lever portion and said holder to retain said lever portion in a latched position.

7. A mounting as claimed in claim 6, including a recess at said one end of the holder, said lever portion positioned in said recess when in said latched position.

8. A mounting as claimed in claim 7, including a recess in said flat support surface of said holder at said one corner of said holder, said web portion of said latching and ejecting member positioned in said recess whereby said latching and ejecting member is retained in position by a ceramic circuit member when the ceramic circuit member is positioned in the holder.

9. A mounting as claimed in claim 2, said frame including two end guide and support members, and a plurality of intermediate guide and support members positioned between said end guide and support members.

10. A mounting as claimed in claim 9, said support and guide formations at a rear end of the frame for attachment to a circuit board, comprising;

an arm extending from at least the two end guide and support members and a hollow boss at the outer end of each arm, attachment to a circuit board obtained by a screw passing through each hollow boss and a hole in the circuit board.

11. A mounting as claimed in claim 10, including a projection on each guide and support member, said circuit board having an edge resting on said projections, said bosses positioned on the surface of the circuit board remote from the projections on the guide and support members.

* * * * *